US011188459B2

(12) United States Patent
Muchherla et al.

(10) Patent No.: US 11,188,459 B2
(45) Date of Patent: Nov. 30, 2021

(54) DATA BLOCK SWITCHING AT A MEMORY SUB-SYSTEM

(71) Applicant: MICRON TECHNOLOGY, INC., Boise, ID (US)

(72) Inventors: Kishore Kumar Muchherla, Fremont, CA (US); Peter Feeley, Boise, ID (US); Sampath K. Ratnam, Boise, ID (US); Kevin R. Brandt, Boise, ID (US); Cory M. Steinmetz, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 35 days.

(21) Appl. No.: 16/725,792

(22) Filed: Dec. 23, 2019

(65) Prior Publication Data

US 2021/0191852 A1 Jun. 24, 2021

(51) Int. Cl.

| | |
|---|---|
| ***G06F 12/02*** | (2006.01) |
| ***G11C 11/56*** | (2006.01) |
| ***G06F 12/0868*** | (2016.01) |
| ***G06F 9/54*** | (2006.01) |
| ***G06F 12/0877*** | (2016.01) |
| ***G06F 11/30*** | (2006.01) |

(52) U.S. Cl.

CPC .......... *G06F 12/0246* (2013.01); *G06F 9/544* (2013.01); *G06F 11/3037* (2013.01); *G06F 12/0253* (2013.01); *G06F 12/0868* (2013.01); *G06F 12/0877* (2013.01); *G11C 11/5628* (2013.01); *G06F 2212/7203* (2013.01); *G06F 2212/7205* (2013.01); *G11C 2211/5641* (2013.01); *G11C 2211/5643* (2013.01)

(58) Field of Classification Search

None

See application file for complete search history.

(56) References Cited

U.S. PATENT DOCUMENTS

| | | | | |
|---|---|---|---|---|
| 9,727,249 | B1 * | 8/2017 | Subramanian | G11C 16/10 |
| 9,747,202 | B1 * | 8/2017 | Shaharabany | G06F 12/0246 |
| 2010/0172180 | A1 * | 7/2010 | Paley | G06F 12/0246 365/185.12 |
| 2012/0254574 | A1 * | 10/2012 | Sinclair | G11C 11/5628 711/165 |
| 2016/0092129 | A1 * | 3/2016 | Agarwal | G11C 11/5621 714/764 |
| 2016/0364337 | A1 * | 12/2016 | Hale | G06F 12/0871 |
| 2018/0211708 | A1 * | 7/2018 | Igahara | G06F 3/0679 |
| 2018/0293003 | A1 * | 10/2018 | Muchherla | G06F 3/0679 |
| 2019/0065367 | A1 * | 2/2019 | Li | G06F 12/0246 |
| 2019/0095116 | A1 * | 3/2019 | Igahara | G06F 3/0619 |

* cited by examiner

*Primary Examiner* — Nathan Sadler

(74) *Attorney, Agent, or Firm* — Lowenstein Sandler LLP

(57) ABSTRACT

Host data can be written to a first portion of a memory sub-system in a first write mode. An indication can be received that a data block of a second portion of the memory sub-system is available to be written to in a second write mode. In response to receiving the indication, it is determined to write a second portion of the host data to the data block of the second portion. In response to determining to write the second portion of the host data to the data block of the second portion, the second portion of the host data is written to the second available data block in the second write mode prior to closing the first available data block in the first write mode.

20 Claims, 10 Drawing Sheets

200

Receive host data to be written to a memory sub-system 210

Write a first portion of the host data to a first available data block of the memory sub-system, where the first available data block is associated with a first write mode 220

Receive an indication that a second available data block of the memory sub-system is available to be written to, where the second available data block is associated with a second write mode 230

Determine to write a second portion of the host data to the second available data block based on the received indication 240

In response to determining to write the second portion of the host data at the second available data block, write the second portion of the host data to the second available data block in the second write mode prior to closing the first available data block in the first write mode 250

DATA BLOCK SWITCHING AT A MEMORY SUB-SYSTEM

TECHNICAL FIELD

The present disclosure generally relates to a memory sub-system, and more specifically, relates to data block switching at a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various implementations of the disclosure.

DETAILED DESCRIPTION

Figure 1:
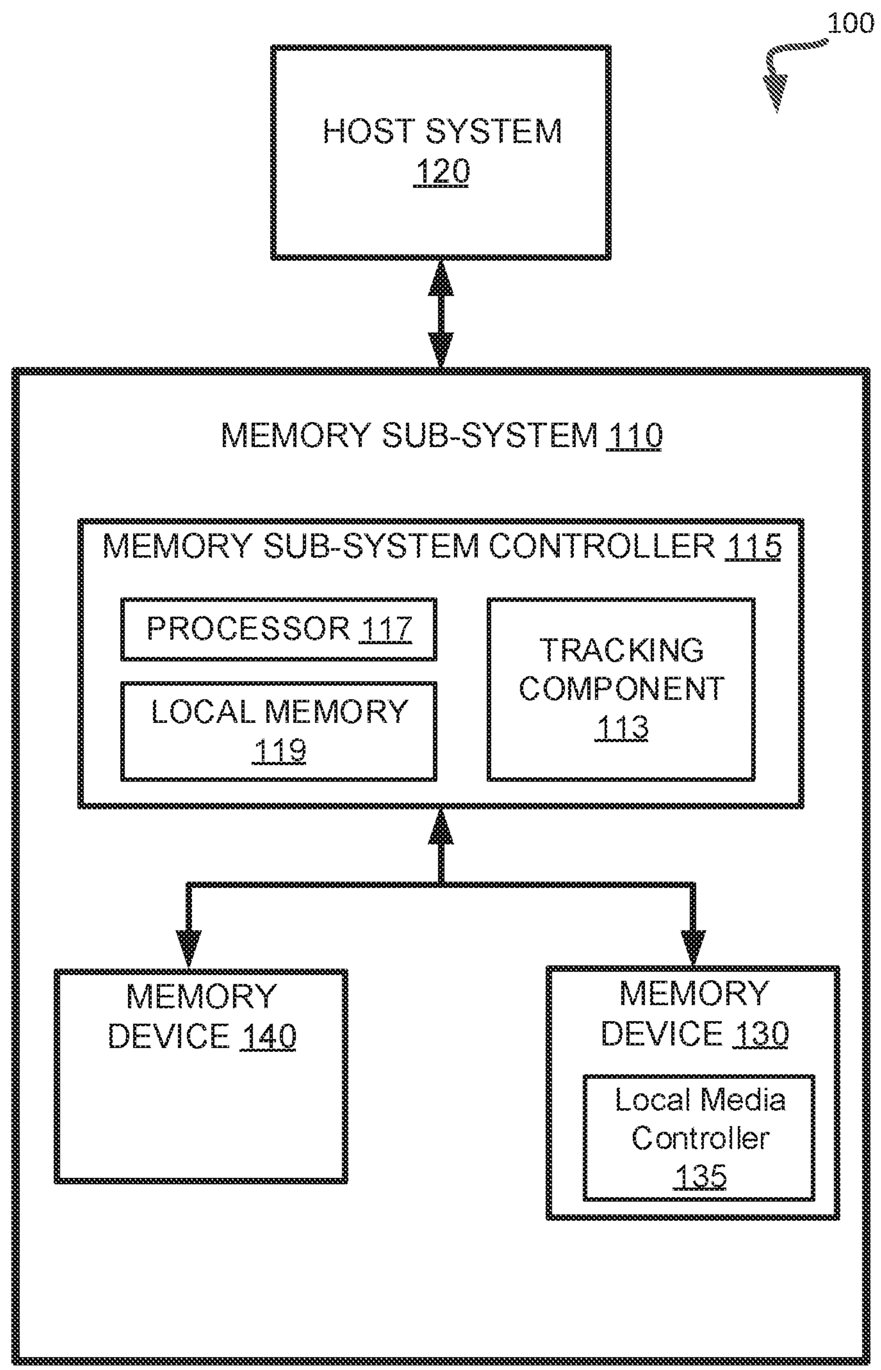
FIG. 1 illustrates an example computing system that includes a memory sub-system in accordance with embodiments of the present disclosure.

Aspects of the present disclosure are directed to data block switching at a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory device can be a non-volatile memory device. A non-volatile memory device is a package of one or more dice. Each die can consist of one or more planes. Planes can be groups into logic units (LUN). For some types of non-volatile memory devices (e.g., NAND devices), each plane consists of a set of physical blocks. Each block consists of a set of pages. Each page consists of a set of memory cells ("cells"). A cell is an electronic circuit that stores information. A data block hereinafter refers to a unit of the memory device used to store data and can include a group of memory cells, a word line group, a word line, or individual memory cells.

Data operations can be performed by the memory sub-system. The data operations can be host-initiated operations. For example, the host system can initiate a data operation (e.g., write, read, erase, etc.) on a memory sub-system. The host system can send access requests (e.g., write command, read command) to the memory sub-system, such as to store data on a memory device at the memory sub-system and to read data from the memory device on the memory sub-system. The data to be read or written, as specified by a host request, is hereinafter referred to as "host data". A host request can include logical address information (e.g., logical block address (LBA), namespace) for the host data, which is the location the host system associates with the host data. The logical address information (e.g., LBA, namespace) can be part of metadata for the host data. Metadata can also include error handling data (e.g., ECC code word, parity code), data version (e.g. used to distinguish age of data written), valid bitmap (which LBAs or logical transfer units contain valid data), etc.

A memory sub-system can perform various operations with respect to one or more memory devices included in the memory sub-system. For example, read operations, program (i.e., write) operations, and erase operations can be performed at one or more memory devices. Memory devices can include one or more data blocks, which can include one or more arrays of memory cells such as single level cells (SLCs) that are each used to store a single bit of data or memory cells that each store multiple bits of data, such as multi-level cells (MLCs), triple-level cells (TLCs), or quad-level cells (QLCs) (collectively referred to herein as XLCs). Each memory cell type can have a different data density, which corresponds to an amount of data (e.g., bits of data) that can be stored per memory cell.

A memory device can be configured to include one or more data blocks with SLCs (referred to as SLC data blocks) and one or more data blocks with XLCs (referred to as XLC data blocks). The memory device can also be configured such that a first portion of the memory device is provisioned as a cache while a second portion of the memory device is provisioned as a user space. In some conventional memory sub-systems, the cache can include one or more SLC memory units (e.g., blocks) and the user space can include one or more XLC memory units. A memory unit can include a group of memory cells, a word line group, a word line, or individual memory cells. For example, a memory unit can include one or more blocks. The cache can also be provisioned to include one or more XLC memory units so that the cache includes both SLC memory units and XLC memory units. In response to a determination that additional user space is to be provisioned at the memory device, the XLC memory units of the cache can be re-configured as user space memory units.

A host cursor can be used to manage the performance of the write operation. A cursor can manage the execution of a memory operation by determining where, when, and in what sequence to write host data to memory devices. In some examples, a cursor can be a pointer to an available data block of the memory device. The host cursor can indicate an available data block (also referred to as an open block or an open data block) of the memory device that is available to store incoming host data. In some examples, the available data block can be an empty data block where all memory cells of the data block are available to store host data, or a partially empty data block where data is written to one or more memory cells of the data block while one or more other memory cells of the data block are available to store host data. In conventional memory sub-systems, a single host cursor can be used to manage the performance of write operations. The cache can include one or more available data blocks and the host cursor can indicate an available data block of the cache to store incoming host data, in SLC mode or in XLC mode. In response to determining that the cache does not include an available data block, the host cursor can indicate an available data block of the user space to store incoming host data in XLC mode. Subsequent incoming host data can be written to available user space data blocks, as indicated by the host cursor, until the user space does not include an available data block.

During operation of the memory sub-system, an idle time period can occur where incoming host data is not received to be stored at the memory sub-system. In some instances, no cache data blocks are available for incoming host data and one or more user space data blocks are available for incoming host data at the initiation of the idle time period. As such, at the initiation of the idle time period, the host cursor can indicate a user space data block as an available data block. The available user space data block indicated by the host cursor can be a partially empty data block. A media management operation, such as a garbage collection operation, can be performed at the memory sub-system during the idle time period to make one or more data blocks of the cache and/or the user space available for subsequent incoming host data. After the idle time period is complete, incoming host data can be received to be stored at the memory sub-system. In response to the host cursor, at the initiation of the idle time period, indicating a partially available data block as an available user data block, incoming host data can be stored at the partially available data block in XLC mode instead of a newly available cache data block in SLC mode.

Conventional memory sub-systems do not provide a mechanism for host data to be written to available cache data blocks in SLC mode if a user space data block is not closed (i.e., is available). As a result, incoming host data is written to the available user space data block in XLC mode to close the available user space data block even though one or more cache data blocks are available. A data block can be considered to be closed when data is written to each memory cell of the data block. A significant reduction in write performance results since instead of writing host data to the available cache data block in SLC mode, host data is written to the available user space data block in XLC mode to close the user space data block, and the XLC mode latency is larger than the SLC mode latency.

Aspects of the present disclosure address the above and other deficiencies by providing a first available data block, indicated by a first host cursor, and a second available data block, indicated by a second host cursor. By providing a second host cursor to indicate the second available data block, a mechanism is provided for host data to be written to the cache in SLC mode even though a user space data block, opened in XLC mode, is not closed. The first host cursor and the second host cursor can serve as a record of available data blocks in both the cache and the user space of the memory sub-system. Using the first host cursor and the second host cursor, the memory sub-system can identify and select an available data block to write incoming host data to reduce write operation latency.

Advantages of the present disclosure include, but are not limited to, an improved performance of the memory sub-system as the overall write operation latency can be reduced. For example, host data can be written to a cache data block in SLC mode rather than a user space data block in XLC mode, even though the user space data block has not been closed (i.e., contains one or more available XLCs). Thus, by providing at least a second host cursor to indicate a second available data block, a write operation can be successfully performed in less time than if only one available data block was indicated by a first host cursor. As such, since the write operation can be performed in less time, the overall write latency of the memory sub-system can be decreased. The decreasing of the write latency can result in the memory sub-system being capable of satisfying Quality of Service (QoS) requirements that specify various operating requirements when performing the write operations at the memory sub-system.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between devices, which can be an indirect communicative connection or direct communicative connection (e.g., without intervening devices), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory devices such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., processing device) configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory subsystem 110 includes a cursor component 113 that can be used to maintain two or more host cursors of the memory sub-system 110. In some embodiments, the controller 115 includes at least a portion of the cursor component 113. For example, the controller 115 can include a processor 117 (processing device) configured to execute instructions stored in local memory 119 for performing operations described herein. In some embodiments, the cursor component 113 is part of the host system 120, an application, or an operating system.

The cursor component 113 can maintain two or more host cursors that each indicate an available data block of the memory subsystem for host data to be written to. A first host cursor can identify an available data block of a first portion of the memory sub-system, where the first portion corresponds to a first write mode. A second host cursor can identify an available data block of a second portion of the memory sub-system, where the second portion corresponds to a second write mode. The first write mode can correspond to a first number of bits per memory cell of the memory subsystem, and the second write mode can correspond to a second number of bits per memory cell of the memory subsystem. In some implementations, the first number of bits per memory cell is larger than the second number of bits per memory cell. In other implementations, the second number of bits is larger than the first number of bits. Based on an availability of a data block of the first portion of the memory sub-system, the cursor component can determine to write host data at the data block associated with the first host cursor or a data block associated with the second host cursor. Further details with regards to the operations of the cursor component 113 are described herein.

Figure 2:
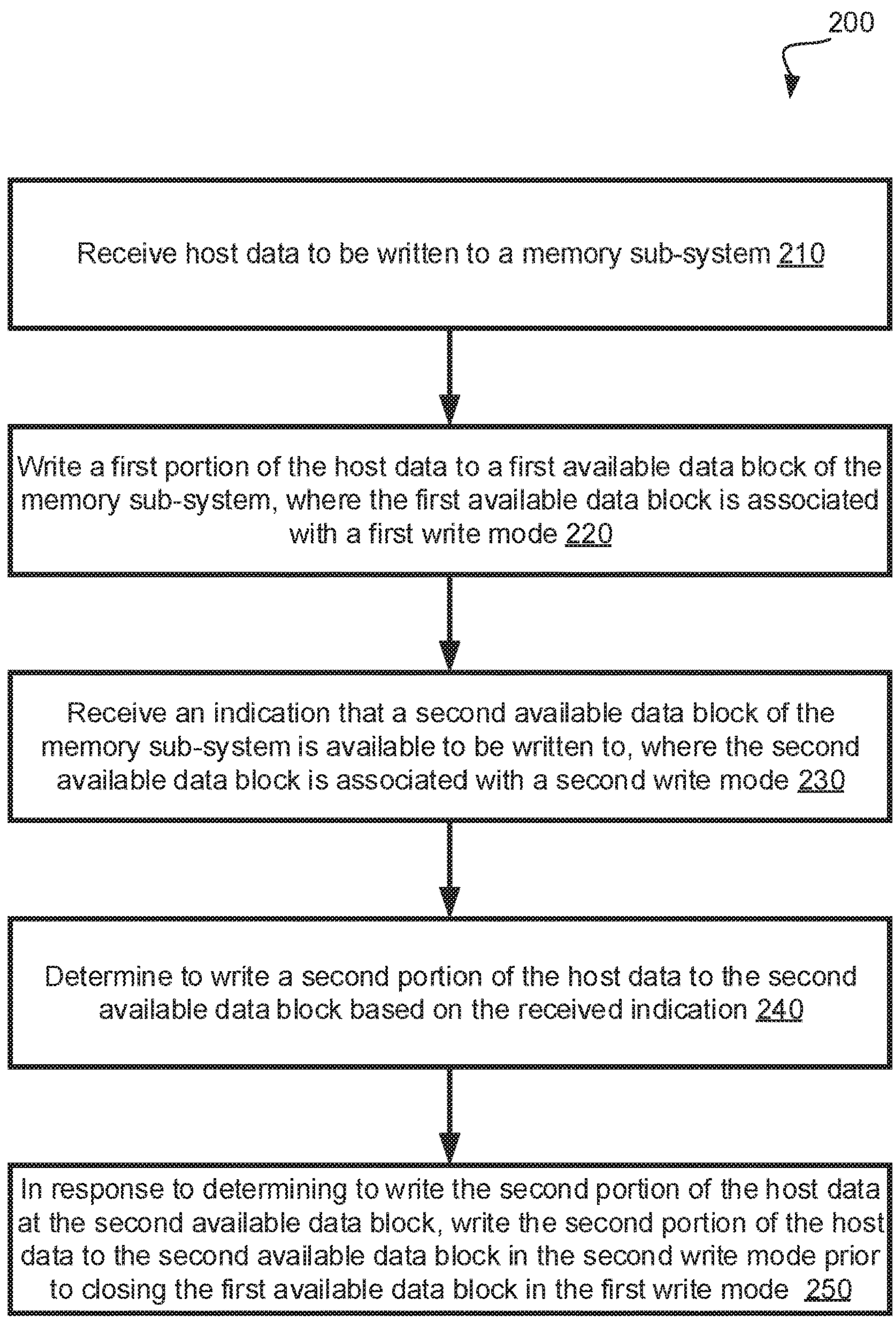
FIG. 2 illustrates a flow diagram of an example method to perform data block switching for writing host data at an example memory device, in accordance with some embodiments of the present disclosure.

FIG. 2 is a flow diagram of an example method 200 to perform data block switching for writing host data at an example memory device, in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the cursor component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiments. Other process flows are possible.

At operation 210, the processing device receives host data to be written to a memory sub-system. The memory sub-system can include one or more memory devices, where each memory device can include one or more data blocks. Each data block can include one or more arrays of memory cells, such SLCs or XLCs. Each memory cell type can have a different data density, which corresponds to an amount of data (e.g., bits of data) that can be stored per memory cell.

The memory sub-system can be configured such that one or more portions of the memory sub-system are used in various modes. For example, a first portion of the memory sub-system can be used as a cache and second portion of the memory sub-system can be exposed as user space. The cache can be a portion of the memory sub-system where host data is temporarily stored prior to being moved for long-term storage at the user space. In some embodiments, data written to one or more blocks of the cache can be written in SLC mode. In other or similar embodiments, data written to one or more blocks of user space can be written in XLC mode. If no cache blocks are available to store incoming host data in SLC mode, host data can be written to user space in XLC mode, rather than data being first written at the cache in SLC mode and then rewritten at the user space in XLC mode.

At operation 220, the processing device writes a first portion of the host data to a first available data block of the memory sub-system, where the first available data block is associated with a first write mode. The first available data block can be an empty data block (i.e., all memory cells of the data block are available for host data) or a partially empty data block (i.e., data is written to one or more memory cells of the data block and one or more other memory cells of the data block are available for host data). In some examples, the first available data block can be included in the first portion of the memory sub-system (i.e., the user space), where the first portion corresponds to at least the first write mode. The first write mode can correspond to programming the first number of bits per memory cell of the first available data block. For example, the first available data block can include one or more QLCs. As a result, the first write mode can be a QLC write mode. The first open block can be identified as an available data block by a first host cursor.

At operation 230, the processing device receives an indication that a second available data block of the memory sub-system is available for host data, where the second available data block is associated with a second write mode. In some examples, the second available data block can be included in the second portion of the memory sub-system (i.e., the cache), where the second portion corresponds to at least the second write mode. The second write mode can correspond to a second number of bits per memory cell of the second available data block. For example, the second available data block can include one or more SLCs. As a result, the second write mode can be an SLC write mode. The second available data block can be identified as an available data block by a second host cursor.

The indication that a second available data block is available can be transmitted to the processing device as a result of a garbage collection operation being completed on one or more data blocks of the second portion of the memory sub-system.

At operation 240, the processing device determines to write a second portion of the host data to the second available data block based on the received indication. In some examples, when the indication is received, the first available data block can be available for the second portion of the host data (i.e., can contain one or more XLCs). The processing device can determine to write the second portion of the host data to the second available data block before the first available data block is closed. For example, data can be written to the second available data block before data is written to all memory cells of the first available data. The processing device can determine to write the second portion of the host data to the second available data block because the second available data block is associated with a smaller number of bits per memory cell than the first available data block and, as a result, a write operation latency associated with writing the second portion of the host data to the second available data block is less than a write operation latency associated with writing the second portion of the host data to the first available data block.

At operation 250, the processing device, in response to determining to write the second portion of the host data to the second available data block, writes the second portion of the host data to the second available data block in the second write mode prior to closing the first open block in the first write mode. For example, the second portion of the host data can be written to the second available data block prior to host data being written to each memory cell of the first open block.

Figure 3A:
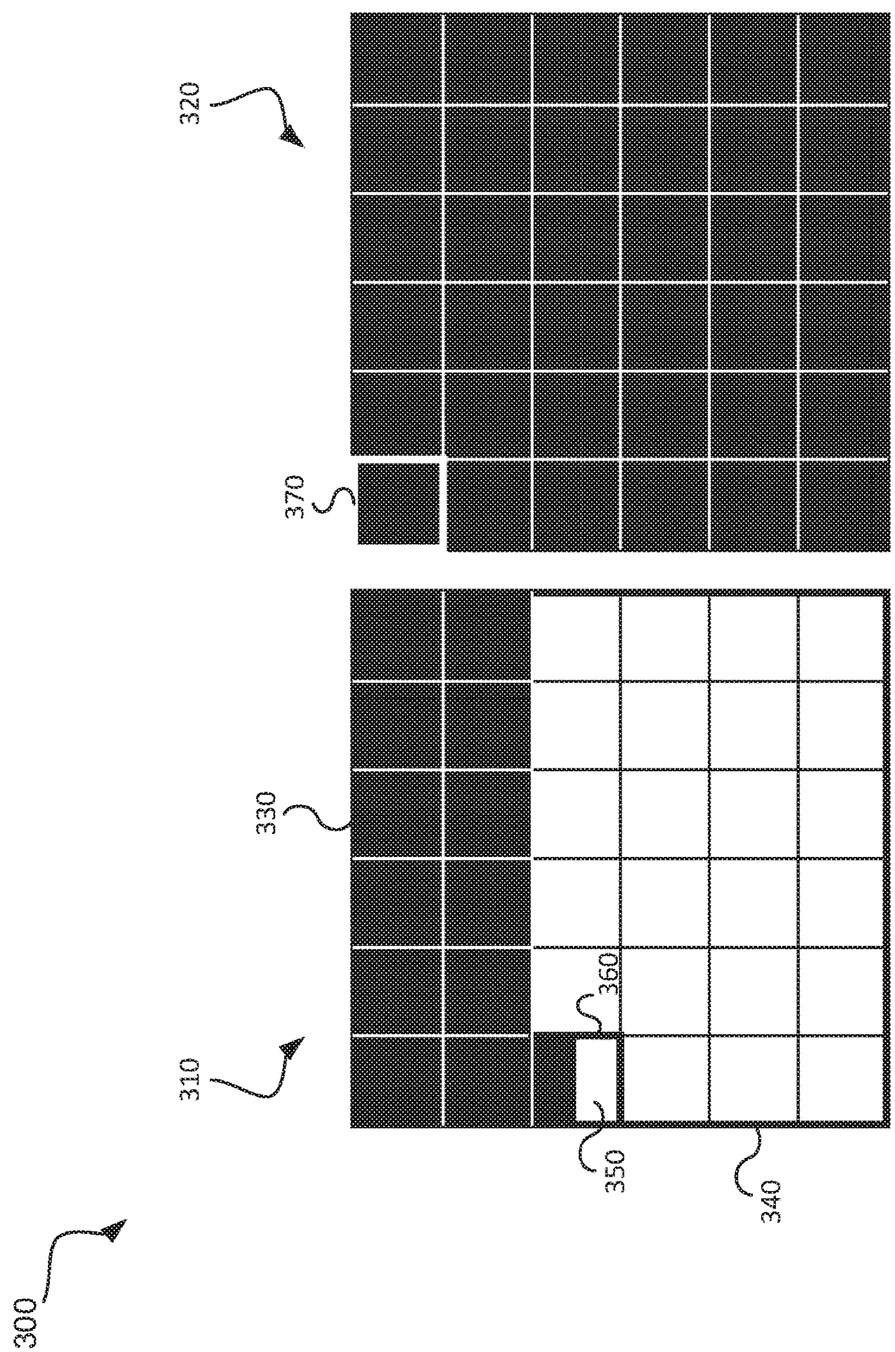
FIG. 3A illustrates an example memory device associated with a first write mode and a second write mode, in accordance with some embodiments of the present disclosure.

FIG. 3A illustrates an example memory device 300, in accordance with some embodiments of the present disclosure. In some embodiments, the memory device 300 can include a first portion 310 and a second portion 320. The first portion 310 and the second portion 320 can be portions of a single memory device 300. In other embodiments, the first portion 310 can be a first memory device and the second portion 320 can be a second memory device of the memory sub-system.

The first portion 310 and the second portion 320 can each include at least one data block. Each data block can include one or more arrays of memory cells, such as SLCs or XLCs. In some embodiments, a data block can be at least one of a closed data block 330 or an available data block (i.e., empty data block 340 or partially empty data block 350). A closed data block 330 can be a data block where all memory cells are filled with at least one of host data or garbage collection data. The host data can be data received from a host system (e.g., host system 120 of FIG. 1) to be written to memory device 300. The garbage collection data can include data that previously was written to a data block of memory device 300 and has been moved to another data block during a garbage collection process. The closed data block 330 can be completely filled with data, and therefore is not available for data to be written to. As discussed previously, an available data block can include at least one memory cell that is available to store new host data.

The one or more data blocks of the first portion 310 can be associated with a first write mode. The first write mode can correspond to a first number of bits per memory cell of each data block. In some embodiments, the first write mode can correspond to two or more bits per memory cell (i.e., XLCs). The one or more data blocks of the second portion 320 can be associated with a second write mode. The second write mode can correspond to a second number of bits per memory cell of each data block. In some embodiments, the second write mode can correspond to one bit per memory cell (i.e., SLCs). In some embodiments, the first number of bits per memory cell of the first write mode can be larger than the second number of bits per memory cell of the second write mode.

The first portion 310 can correspond to a first host cursor 360, and second portion 320 can correspond to a second host cursor 370. The first host cursor 360 can indicate a data block of the first portion 310 that is available to write incoming host data, while the second host cursor 370 can indicate a data block of the second portion 320 that is available to write incoming host data.

Figure 3B:
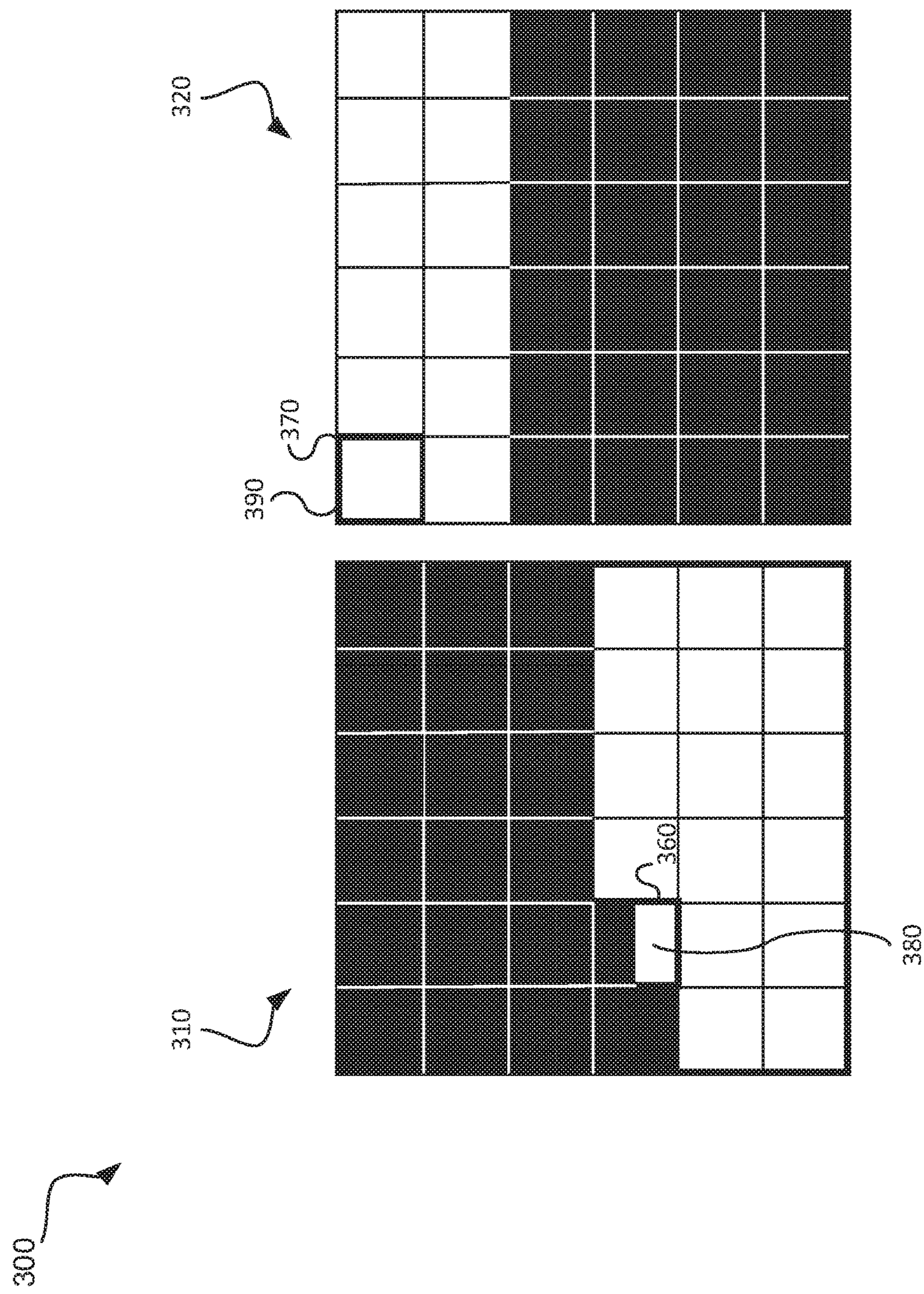
FIG. 3B illustrates switching from writing host data to a first open block associated with a first write mode to a second available data block associated with a second write mode of an example memory device, in accordance with some embodiments of the present disclosure.

FIG. 3B illustrates switching from writing host data to a first available data block 380 associated with a first write mode to a second available data block 390 associated with a second write mode of an example memory device 300, in accordance with some embodiments of the present disclosure. Host data can be received by memory device 300 from a host system, where the host data is to be written to a first available data block 380 of memory device 300. As host data is written to the first available data block, the memory cells of the first available data block 380 can be filled with host data, such that the first available data block 380 becomes closed. If the first available data block 380 becomes closed, the first host cursor 360 can be updated to indicate another available data block of the first write mode portion for which to write host data.

An indication can be received that a second available data block 390 of memory device 300 is available for storing host data. In some embodiments, the second available data block 390 can be an available data block of the second portion 320. Based on the received indication, the processing device can determine whether to write a second portion of the host data to the first available data block 380 of memory device 300, indicated by the first host cursor 360, or the second available data block 390 of memory device 300, indicated by the second host cursor 370. In some examples, the first available data block 380 indicated by the first host cursor 360 can be a partially empty data block. Instead of writing the second portion of the host data to the partially empty first available data block 380, the processing device can determine to write the second portion of the host data to the second available data block 390 before closing the first available data block 380. The processing device can determine to write the second portion of the host data to the second available data block 390 because the second available data block 390 is associated with a smaller number of bits per memory cell than the first available data block 380 and, as a result, a write operation latency associated with writing the second portion of the host data to the second available data block 390 is less than a write operation latency associated with writing the second portion of host data to the first available data block 380.

Figure 3C:
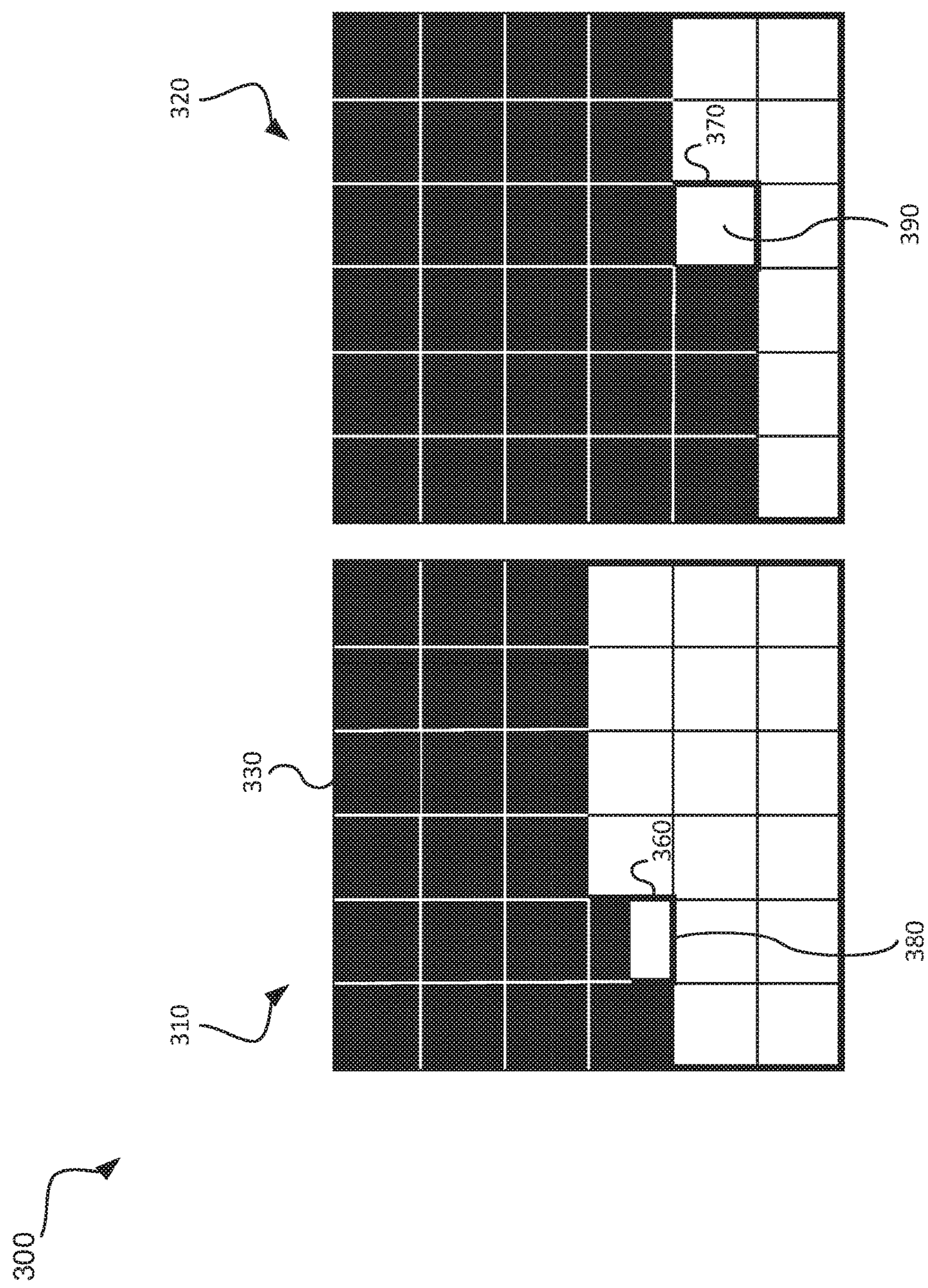
FIG. 3C illustrates writing host data to a second available data block in the second write mode of an example memory device, in accordance with some embodiments of the present disclosure.

FIG. 3C illustrates writing host data to the second available data block 390 in a second write mode of an example memory device 300, in accordance with some embodiments of the present disclosure. The processing device can determine to write a second portion of host data to the second available data block 390 in the second write mode.

Responsive to determining to write the second portion of host data to the second available data block 390, the second portion of host data can be written to the second available data block 390. The second available data block 390 can be indicated by the second host cursor 370. As host data is written to the second available data block 390, the memory cells of the second available data block 390 can be filled with host data, such that the second available data block 390 becomes closed. If the second available data block 390 becomes closed, the second host cursor 370 can be updated to indicate another available data block of the second portion 320 for which to write host data. Host data can be written to available data blocks of the second portion 320 until all data blocks of the second portion 320 are closed, or no incoming host data is received.

Figure 4:
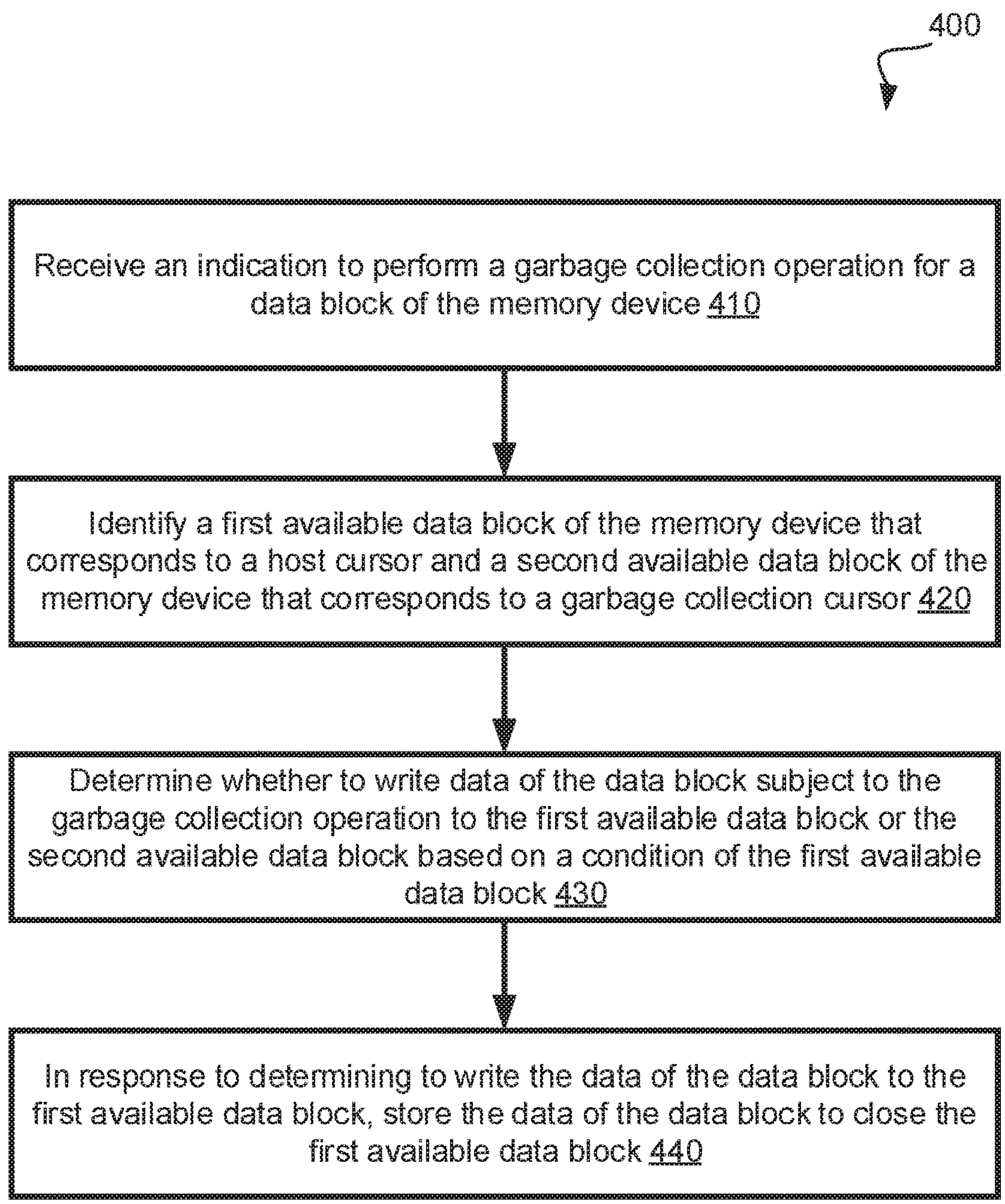
FIG. 4 illustrates a flow diagram of an example method to perform data block switching for garbage collection, in accordance with some embodiments of the present disclosure.

FIG. 4 is a flow diagram of an example method 400 to perform data block switching for garbage collection, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the cursor component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, the processing device receives an indication to perform a garbage collection operation for a data block of a memory device. The memory device can include one or more data blocks, where each data block includes one or more arrays of memory cells, such as SLCs or XLCs. In some examples, the memory device can be configured such that one or more portions are reserved for various purposes. A first portion of the memory device can be provisioned as a cache, where one or more cache data blocks are configured to be written in SLC mode. A second portion of the memory device can be configured as user space, where one or more user space data blocks are configured to be written in XLC mode.

The garbage collection operation can include identifying data blocks in the first portion of the memory device that contain unneeded data and clear the data blocks to maintain optimal write speeds. The garbage collection operation can further include writing needed data to a data block of the second portion of the memory device and removing the written data from the first portion.

At operation 420, the processing device identifies a first available data block of the memory device that corresponds to a host cursor and a second available data block of the memory device that corresponds to a garbage collection cursor. The host cursor can indicate an available data block of the memory device that contains memory cells that are available for host data to be written to. The garbage collection cursor can indicate an available data block of the memory device that is reserved for storing garbage collection data (i.e., data that has been written and removed from a block previously subject to a garbage collection operation).

At operation 430, the processing device determines whether to write data of the data block subject to the garbage collection operation to the first available data block or the second available data block based on a condition of the first available data block. In some examples, the condition of the first available data block can be whether the first available data block is a partially empty data block. The processing device can determine to write data from the data block subject to the garbage collection operation to the partially empty first available data block to close the first available data block, rather than writing data of the data block to the second available data block.

At operation 440, in response to determining to write the data of the data block to the first available data block, the processing device stores data of the data block to the first available data block to close the first available data block. The processing device can determine to write the data to the first available data block based on a memory policy in favor of closing a partially empty block before writing to a different available data block. Once the first available data block is closed, data can no longer be written to the first available data block, as all memory cells of the first available data block are filled. The processing device can determine to write data from other data blocks subject to the garbage collection operation to the second available data block of the memory device that corresponds to the garbage collection cursor.

Figure 5A:
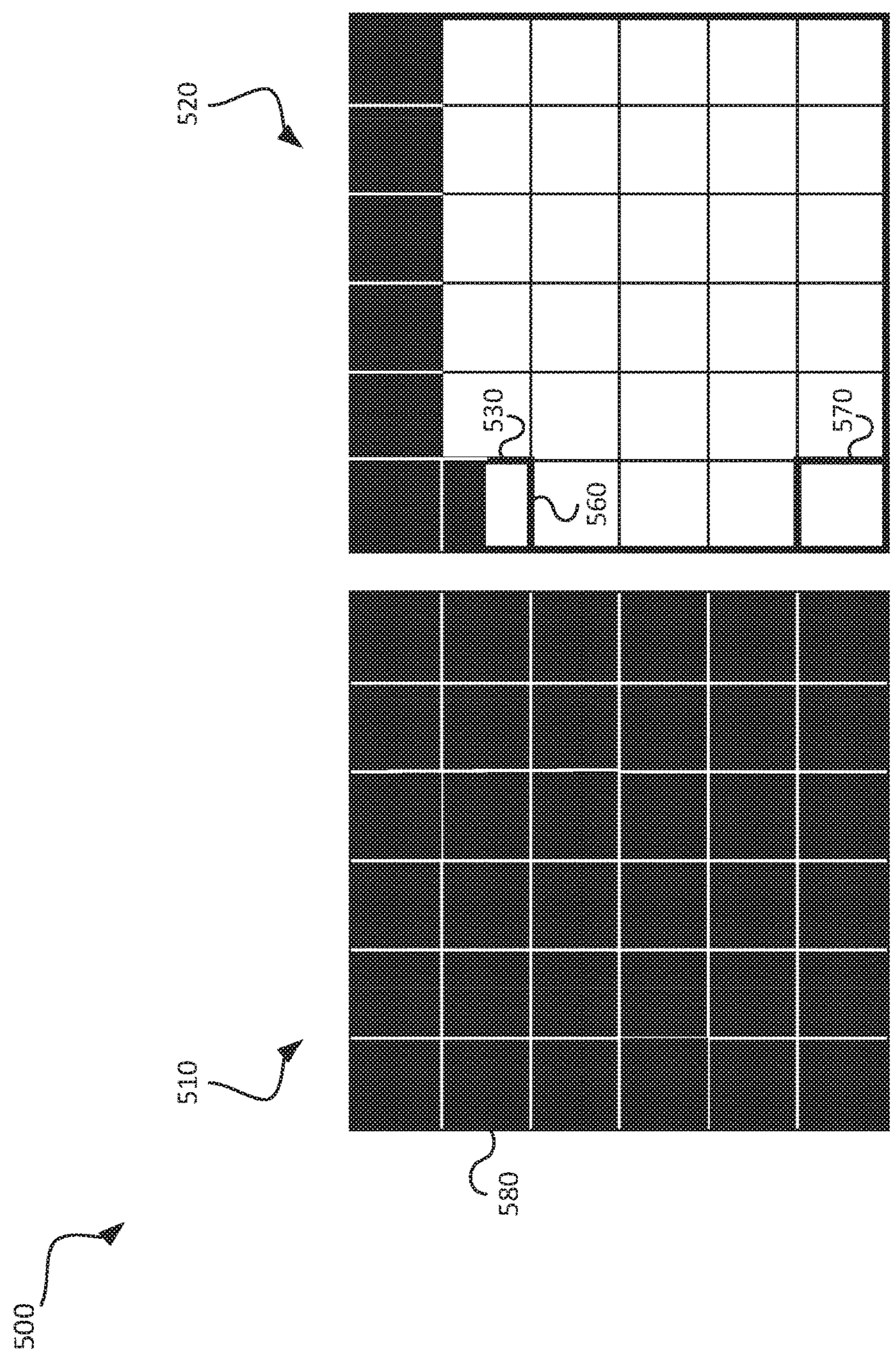
FIG. 5A illustrates an example memory device for performing a garbage collection operation, in accordance with some embodiments of the present disclosure.

FIG. 5A illustrates an example memory device 500 for performing a garbage collection operation, in accordance with some embodiments of the present disclosure. In some embodiments, the memory device 500 can include a first portion 510 and a second portion 520. The first portion 510 and the second portion 520 can be portions of a single memory device 500. In other embodiments, the first portion 510 can be a first memory device and the second portion 520 can be a second memory device.

The first portion 510 and the second portion 520 can each include at least one data block. Each data block can include one or more arrays of memory cells including at least one of SLCs or XLCs. One or more data blocks of the first portion 510 can be associated with a first write mode. The first write mode can correspond to a first number of bits per memory cell of each data block. In some embodiments, the first write mode can correspond to one or more bits per memory cell (i.e., SLCs). One or more data blocks of the second portion 520 can be associated with a second write mode. In some embodiments, the second write mode can correspond to a second number of bits per memory cell of each data block.

The first portion 510 and the second portion 520 can correspond to a host cursor 530. The host cursor 530 can indicate an available data block of the first portion 510 or the second portion 520 for which incoming host data is to be stored. The first portion 510 and the second portion 520 may further correspond with a garbage collection cursor 570. The garbage collection cursor 570 can indicate an available data block of the memory device 500 that is reserved for storing garbage collection data.

A request can be received to perform a garbage collection operation on a data block of memory device 500. A first data block 580 can be selected for garbage collection. First data block 580 can include a closed data block of first portion 510 and/or second portion 520. In some examples, the first data block 580 can be selected based on an amount of unneeded host data (i.e., invalid data) of the first data block 580. The first data block 580 can be selected for garbage collection to remove unneeded data from the first data block 580 to allow for subsequent host data to be stored.

Responsive to receiving a request to perform the garbage collection operation and selecting the first data block 580, a first garbage collection block and a second garbage collection block can be identified. The first garbage collection block can be second data block 560 indicated by the host cursor 530, and the second garbage collection block can be any available data block indicated by the garbage collection cursor 570. It can be determined whether to write the garbage collection data of the first data block 580 to the available data block 560 or the available data block indicated by the garbage collection cursor 570 based on a condition of the available data block 560. In some examples, the condition of the available data block 560 can be whether the available data block 560 is a partially empty data block. The processing device can determine to write garbage collection data of the first data block 580 to the partially empty second available data block 560 to close the second data block 560, rather than writing the garbage collection data of the first data block 580 to the data block indicated by the garbage collection cursor 570.

Figure 5B:
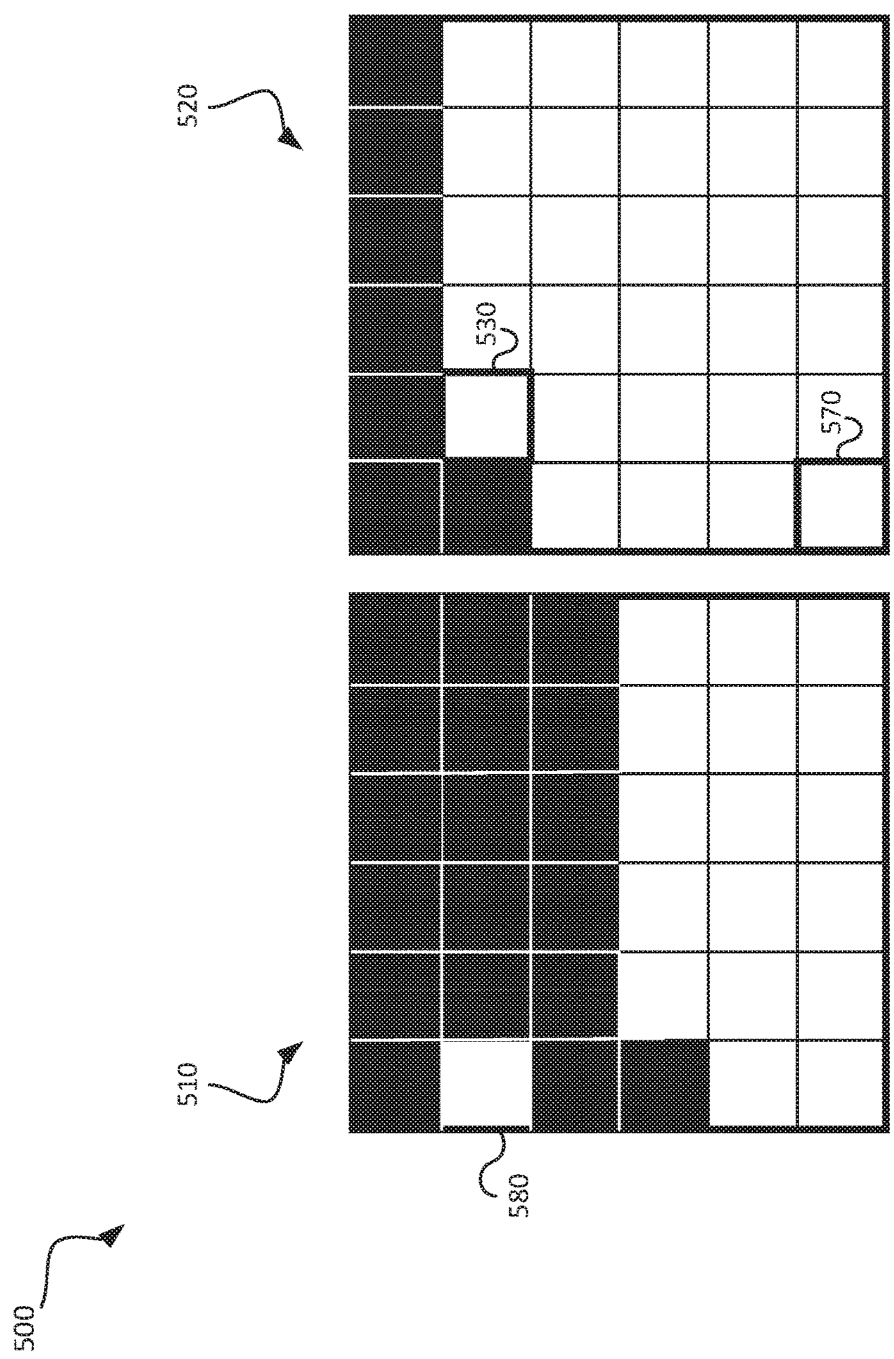
FIG. 5B illustrates performing data block switching for a garbage collection operation for an example memory device, in accordance with some embodiments of the present disclosure.

FIG. 5B illustrates performing a garbage collection operation for an example memory device, in accordance with some embodiments of the present disclosure. As discussed above, the processing device can determine to write garbage collection data of the first data block 580 to the partially empty second data block 560 to close the second data block 560, rather than writing the garbage collection data to the available block indicated by the garbage collection cursor 570. Responsive to determining to write the garbage collection data to the second data block 560, the garbage collection data of the first data block 580 (i.e., the needed data), can be written to the second data block 560 such to fill the second data block 560. The unneeded, and needed, data written to the first data block 580 can be removed from the first data block 580. Responsive to closing the second data block 560, the host cursor 530 can be updated to indicate another available data block of the second portion 520 of the memory device 500.

Figure 5C:
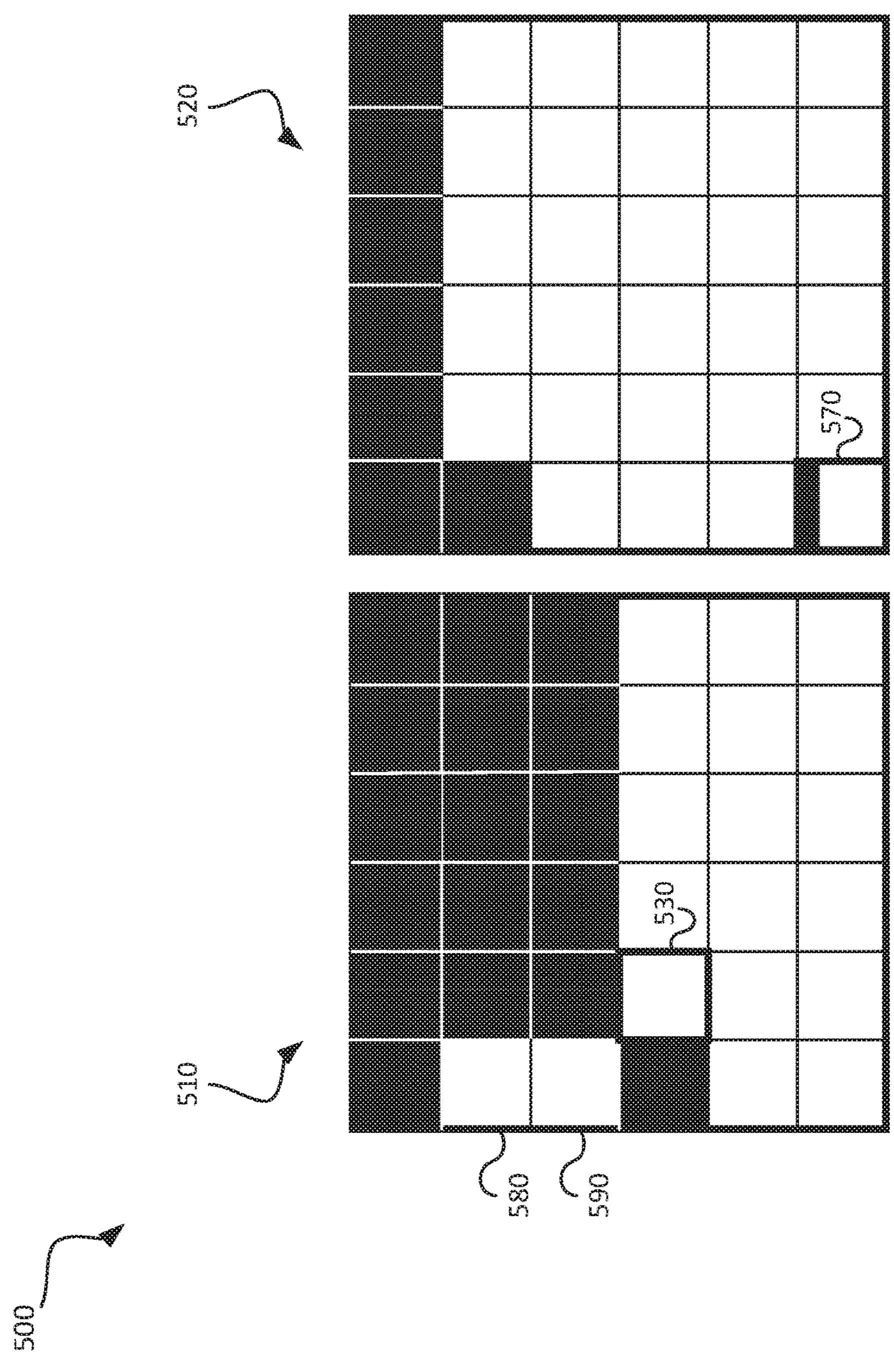
FIG. 5C illustrates performing a garbage collection operation for an example memory device, in accordance with some embodiments of the present disclosure.

FIG. 5C illustrates performing a garbage collection operation for an example memory device, in accordance with some embodiments of the present disclosure. In some examples, a third data block 590 can be selected for garbage collection. An available data block indicated by the host cursor 530, and an available data block indicated by the garbage collection cursor 570, can be identified as candidate data blocks to store the garbage collection data of the third data block 590. The processing device can determine whether to write the garbage collection data of the third data block 590 to the available data block indicated by the host cursor 530 or the garbage collection cursor 570 based on a condition of the available data block indicated by the host cursor 530. In some examples, the condition can be whether the available data block indicated by the host cursor 530 is a partially empty block, Responsive to determining that the available data block indicated by the host cursor 530 is not a partially empty block (i.e., is an empty block), the processing device can determine to write the garbage collection data of the third data block 590 to the available data block indicated by the garbage collection cursor 570. In other or similar examples, the condition can further be whether the host cursor 530 indicates a block in the second portion 520. Responsive to further determining that the host cursor 530 does not indicate a block in the second portion 520, (i.e., indicates a block in the cache to be written in SLC mode), the processing device can determine to write the garbage collection data of the third data block 590 to the available data block indicated by the garbage collection cursor 570.

Responsive to determining to write the garbage collection data to the available data block indicated by the garbage collection cursor 570, the garbage collection data of the third data block 590 can be written to the available data block indicated by the garbage collection cursor 570. The unneeded data, and the needed, written data, of the third data block 590 can be removed from the third data block 590.

Figure 6:
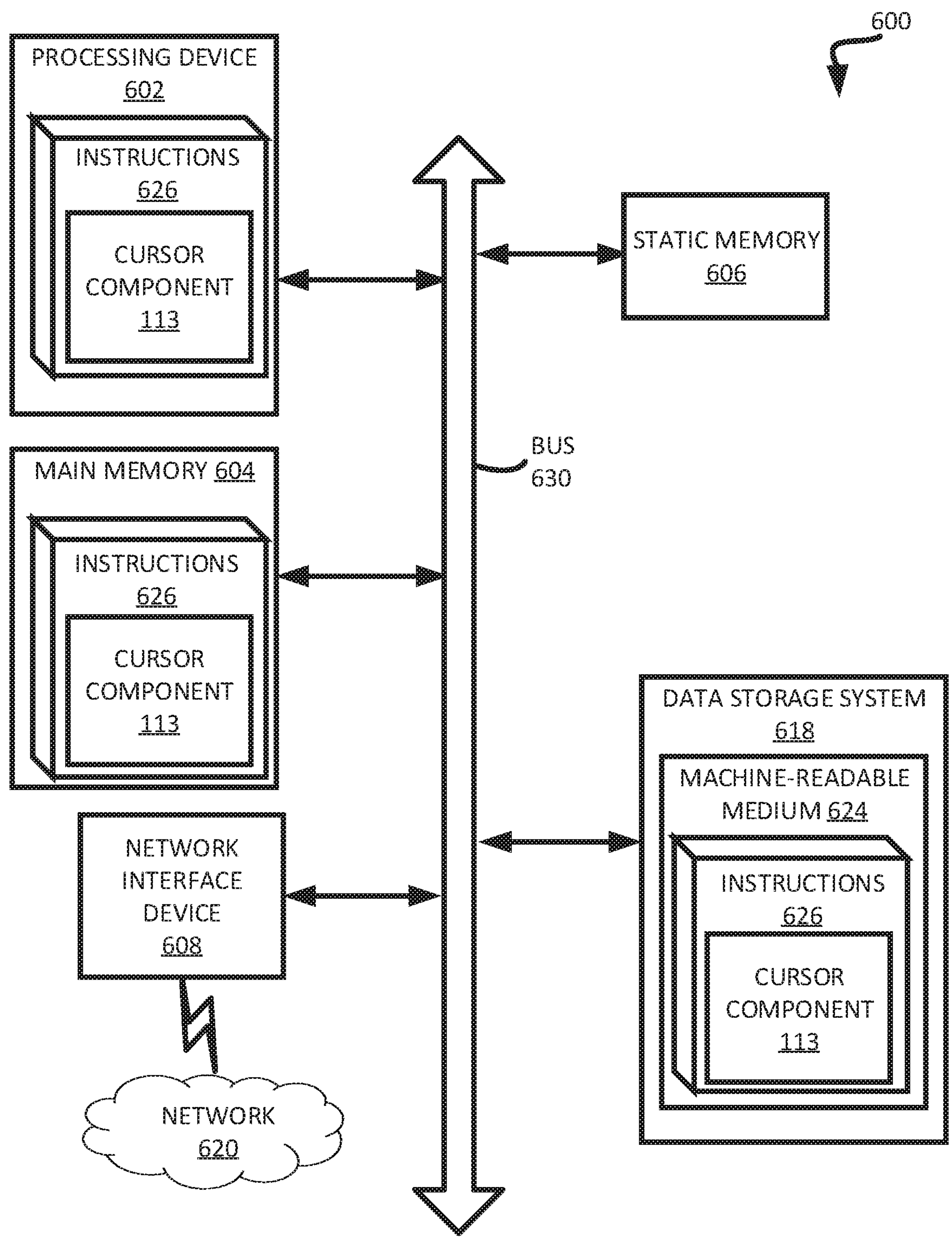
FIG. 6 is a block diagram of an example computer system in which implementations of the present disclosure can operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the cursor component 113 of FIG. 1). In alternative embodiments, the machine can be connected (e.g., networked) to other machines in a LAN, an intranet, an extranet, and/or the Internet. The machine can operation in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface drive 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a cursor component (e.g., the cursor component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer. In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A tangible, non-transitory computer-readable medium storing instructions that, when executed, cause a processing device to:

receive host data to be written at a memory sub-system;

write a first portion of the host data to a first data block of the memory sub-system, wherein the first data block is associated with a first write mode;

detecting that a media management operation performed for a second data block of the memory sub-system has completed, wherein the second data block is associated with a second write mode;

determine to write a second portion of the host data to the second data block in view of the detection; and responsive to determining to write the second portion of the host data to the second data block, write the second portion of the host data to the second data block in the second write mode.

2. The non-transitory computer-readable medium of claim 1, wherein a first cursor corresponds to the first data block and a second cursor corresponds to the second data block, and wherein the first cursor and the second cursor each indicate an data block of the memory sub-system for which to write data.

3. The non-transitory computer-readable medium of claim 2, wherein the second cursor is a garbage collection cursor.

4. The non-transitory computer-readable medium of claim 1, wherein the first write mode corresponds to a first number of bits per memory cell of the memory sub-system and the second write mode corresponds to a second number of bits per memory cell of the memory sub-system, and wherein the first number of bits per memory cell is larger than the second number of bits per memory cell.

5. The non-transitory computer-readable medium of claim 4, wherein the first write mode corresponds to two or more bits per memory cell of the memory sub-system and the second write mode corresponds to one bit per memory cell of the memory sub-system.

6. The non-transitory computer-readable medium of claim 1, wherein the media management operation comprises a garbage collection operation that is performed to empty the second data block.

7. The non-transitory computer-readable medium of claim 1, wherein the second data block is associated with a cache of the memory sub-system, and wherein the processing device is further to:

determine that the cache is available for subsequent write operations.

8. A method comprising:

receiving host data to be written to a memory sub-system;

writing a first portion of the host data to a first data block of the memory sub-system, wherein the first data block is associated with a first write mode;

detecting that a media management operation performed for a second data block of the memory sub-system has completed, wherein the second data block is associated with a second write mode;

determining, by a processing device, to write a second portion of the host data to the second data block in view of the detection; and responsive to determining to write the second portion of the host data to the second data block, writing the second portion of the host data to the second data block in the second write mode prior to closing the first data block in the first write mode.

9. The method of claim 8, wherein a first cursor corresponds to the first data block and a second cursor corresponds to the second data block, and wherein the first cursor and the second cursor each indicate an data block of the memory sub-system for which to write data.

10. The method of claim 9, wherein the second cursor is a garbage collection cursor.

11. The method of claim 8, wherein the first write mode corresponds to a first number of bits per memory cell of the memory sub-system and the second write mode corresponds to a second number of bits per memory cell of the memory sub-system, and wherein the first number of bits per memory cell is larger than the second number of bits per memory cell.

12. The method of claim 11, wherein the first write mode corresponds to two or more bits per memory cell of the memory sub-system and the second write mode corresponds to one bit per memory cell of the memory sub-system.

13. The method of claim 8, wherein the media management operation comprises a garbage collection operation that is performed to empty the second data block.

14. The method of claim 8, wherein the second data block is associated with a cache of the memory sub-system, and wherein the method further comprises:

determining that the cache is available for subsequent write operations.

15. A system comprising:

a memory device; and a processing device, operatively coupled with the memory device, to:

receive an indication to perform a garbage collection operation for a data block of the memory device;

identify a first available data block of the memory device and a second available data block of the memory device, wherein the first available data block corresponds to a host cursor, and wherein the second available data block corresponds to a garbage collection cursor;

determine whether to write data of the data block subject to the garbage collection operation to the first available data block or the second available data block based on a condition of the first available data block; and responsive to determining to write the data of the data block to the first available data block, store the data of the data block to close the first available data block.

16. The system of claim 15, wherein the condition comprises writing the data of the data block subject to the garbage collection operation to the first available data block responsive to the first available data block being a partially empty data block and writing the data to the second available data block responsive to the first available data block being an open data block.

17. The system of claim 16, wherein to close the first available data block corresponds to writing the data to the partially empty data block such that each of a plurality of memory cells of the partially empty data block comprise at least one of host data or garbage collection data.

18. The system of claim 17, wherein the data block is associated with a first write mode that corresponds to a first number of bits per memory cell of the memory device and the first available data block and the second available data block are associated with a second write mode that corresponds to a second number of bits per memory cell of the memory device, and wherein the first number of bits per memory cell is smaller than the second number of bits per memory cell.

19. The system of claim 18, wherein the first write mode corresponds to one bit per memory cell of the memory device and the second write mode corresponds to two or more bits per memory cell of the memory device.

20. The system of claim 15, wherein the host cursor corresponds to an available data block of the memory device for which to write host data and the garbage collection cursor corresponds to an available data block of the memory device for which to store data of one or more data blocks of the memory device subject to the garbage collection operation.

* * * * *